United States Patent
Liu et al.

(10) Patent No.: US 12,225,687 B2
(45) Date of Patent: Feb. 11, 2025

(54) COOLING CAPACITY DISTRIBUTION UNIT AND LIQUID COOLING SYSTEM

(71) Applicant: Huawei Digital Power Technologies Co., Ltd., Shenzhen (CN)

(72) Inventors: Yuan Liu, Dongguan (CN); Dangen Nie, Dongguan (CN); Peiguo Liu, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 300 days.

(21) Appl. No.: 17/969,201

(22) Filed: Oct. 19, 2022

(65) Prior Publication Data

US 2023/0084868 A1    Mar. 16, 2023

Related U.S. Application Data

(63) Continuation of application No. PCT/CN2021/088227, filed on Apr. 19, 2021.

(30) Foreign Application Priority Data

Apr. 21, 2020  (CN) .................. 202010317266.4

(51) Int. Cl.
*H05K 7/20*        (2006.01)
*H02M 5/42*        (2006.01)

(52) U.S. Cl.
CPC ..... *H05K 7/20272* (2013.01); *H05K 7/20263* (2013.01); *H05K 7/20763* (2013.01); *H02M 5/42* (2013.01)

(58) Field of Classification Search
CPC .......... H05K 7/20272; H05K 7/20263; H05K 7/20763
See application file for complete search history.

(56) References Cited

U.S. PATENT DOCUMENTS

| | | | |
|---|---|---|---|
| 7,602,073 B2 * | 10/2009 | Meyers | H01M 16/003 290/1 A |
| 2006/0191667 A1 | 8/2006 | Chen et al. | |
| 2012/0134090 A1 | 5/2012 | Peng | |
| 2013/0097862 A1 | 4/2013 | Campbell et al. | |

(Continued)

FOREIGN PATENT DOCUMENTS

| | | |
|---|---|---|
| CN | 201093794 Y | 7/2008 |
| CN | 202153326 U | 2/2012 |

(Continued)

*Primary Examiner* — Mukundbhai G Patel
(74) *Attorney, Agent, or Firm* — Conley Rose, P.C.

(57) ABSTRACT

A cooling capacity distribution unit includes a liquid-cooled circulating pump disposed in a cabinet, and a frequency converter that supplies power to the liquid-cooled circulating pump. The frequency converter includes an AC-DC module and a DC-AC module. The AC-DC module is configured to be connected to mains, and the DC-AC module is connected to the liquid-cooled circulating pump. The cooling capacity distribution unit further includes a power supply unit, where the power supply unit includes a backup battery disposed in the cabinet, and a DC-DC module connected to the backup battery. The DC-DC module is connected to the DC-AC module and is configured to supply power to the liquid-cooled circulating pump.

20 Claims, 4 Drawing Sheets

(56) References Cited

U.S. PATENT DOCUMENTS

2013/0334880 A1* 12/2013 Jerphagnon ........... H02J 7/0063
324/427
2019/0379269 A1* 12/2019 Huntgeburth ...... H05K 7/20145

FOREIGN PATENT DOCUMENTS

| CN | 203848732 U | 9/2014 |
| CN | 204790794 U | 11/2015 |
| CN | 106255387 A | 12/2016 |
| CN | 106659046 A | 5/2017 |
| CN | 206790356 U | 12/2017 |
| CN | 109787534 A | 5/2019 |
| GB | 2510899 A | 8/2014 |
| WO | 2014012120 A1 | 1/2014 |
| WO | 2014132452 A1 | 9/2014 |
| WO | 2015196807 A1 | 12/2015 |

* cited by examiner

COOLING CAPACITY DISTRIBUTION UNIT AND LIQUID COOLING SYSTEM

CROSS-REFERENCE TO RELATED APPLICATIONS

This is a continuation of Int'l Patent App. No. PCT/CN2021/088227 filed on Apr. 19, 2021, which claims priority to Chinese Patent App. No. 202010317266.4 filed on Apr. 21, 2020, both of which are incorporated by reference.

FIELD

This disclosure relates to the field of heat dissipation technologies, and in particular, to a cooling capacity distribution unit and a liquid cooling system.

BACKGROUND

With innovation and development of computing architectures of artificial intelligence, cloud computing, and big data, an amount of computing on an IT infrastructure is increasing, and requirements for computing efficiency are getting higher. To cope with these challenges, a power density of a data center is also constantly increased, and a high-density data center puts forward a higher requirement for a refrigeration device. A conventional air-cooled air conditioner is deficient in high density, and heat exchange efficiency cannot keep up with computing efficiency. Based on a high-density data center scenario, a liquid cooling system solution has better deployment advantages.

When the liquid cooling system is in use, a liquid-cooled cooling plate can be laid on a flat part of a server, such as the central processing unit (CPU)-graphics processing unit (GPU). Heat of this part is dissipated by circulating heat exchange of a working medium liquid. Heat exchange is performed between an external cooling tower and the working medium liquid in the liquid-cooled cooling plate.

In a liquid cooling system in a conventional technology, cold water generated by a cooling tower of the liquid cooling system in the conventional technology is distributed to a cooling plate by using a cooling capacity distribution unit. When the cooling capacity distribution unit in the conventional technology is in use, a liquid-cooled circulating pump driver in a cabinet is a frequency converter, and the frequency converter only plays a driving role without a backup power function. If the backup power function is needed, an additional backup power system needs to be added separately. Specifically, an uninterruptible power supply (UPS) and a battery are added, and a drive frequency converter and a backup power system of the liquid-cooled circulating pump are independent, which occupy a large space. In addition, functions of some modules in the UPS and the frequency converter are repeated, reducing system efficiency and increasing system costs.

SUMMARY

This disclosure provides a cooling capacity distribution unit and a liquid cooling system, to simplify a structure of the cooling capacity distribution unit and improve a water supply effect.

According to a first aspect, a cooling capacity distribution unit is configured to distribute a cooling capacity in a liquid cooling system. The cooling capacity distribution unit includes a cabinet, and the cabinet serves as a bearing structure and is configured to bear another component. The cooling capacity distribution unit further includes a liquid-cooled circulating pump disposed in the cabinet, and a frequency converter that supplies power to the liquid-cooled circulating pump. The frequency converter includes an alternating current (AC)-direct current (DC) module and a DC-AC module. The AC-DC module is configured to be connected to mains, and the DC-AC module is connected to the liquid-cooled circulating pump. The cooling capacity distribution unit further includes a power supply unit, where the power supply unit includes a backup battery disposed in the cabinet, and a DC-DC module connected to the backup battery. The DC-DC module is connected to the DC-AC module and is configured to supply power to the liquid-cooled circulating pump. By using the disposed DC-DC module and the backup battery disposed in the cabinet, the cooling capacity distribution unit can provide its own power supply and a self-contained power function, to eliminate a UPS and its backup power outside the cooling capacity distribution unit, and reduce costs and an occupied space. The self-contained power is added with an interface on the basis of a driver to avoid low efficiency of multi-level conversion.

In an optional implementation, the frequency converter includes a housing, and the DC-DC module is disposed in the frequency converter. A battery bridge arm interface is disposed in the housing, and the DC-DC module is connected to the backup battery by using the battery bridge arm interface. Safety of the DC-DC module is improved.

In an optional implementation, the cooling capacity distribution unit further includes a controller. The controller is connected to the frequency converter and is configured to control the liquid-cooled circulating pump to operate. The controller can control operation of the liquid-cooled circulating pump.

In an optional implementation, the controller is further configured to detect a flow rate and a flow velocity of the liquid-cooled circulating pump. It is convenient to distribute water.

In an optional implementation, the power supply unit, the frequency converter, and the controller are arranged from bottom to top along a height direction of the cabinet. It is convenient for equipment maintenance and device replacement.

In an optional implementation, the cooling capacity distribution unit further includes a pipe layer, the pipe layer is connected to the liquid-cooled circulating pump, and the pipe layer is disposed between the backup battery and the liquid-cooled circulating pump. Space in the cabinet is properly used.

In an optional implementation, the cooling capacity distribution unit further includes a shock absorber. The liquid-cooled circulating pump is connected to the cabinet by using the shock absorber. Impact of the liquid-cooled circulating pump on the cabinet when the liquid-cooled circulating pump operates is reduced.

In an optional implementation, the liquid-cooled circulating pump is a vertical pump or a horizontal pump. Water supply is realized by using different liquid-cooled circulating pumps.

According to a second aspect, a liquid cooling system is provided. The liquid cooling system is configured to cool a computer room. The liquid cooling system includes a refrigeration system and the cooling capacity distribution unit described above and connected to the refrigeration system. By using a disposed DC-DC module and a backup battery disposed in a cabinet, the cooling capacity distribution unit can provide its own power supply and a self-contained power function, to eliminate a UPS and its backup power outside the cooling capacity distribution unit, and reduce costs and an occupied space. The self-contained power is added with an interface on the basis of a driver to avoid low efficiency of multi-level conversion.

In an optional implementation, the refrigeration system includes a cooling tower and a plate heat exchanger connected to the cooling tower. The plate heat exchanger is connected to the cooling capacity distribution unit. Heat exchange is performed by using the plate heat exchanger to implement one-level heat exchange, and another plate heat exchanger does not need to be disposed in the cooling capacity distribution unit, simplifying a structure of the cooling capacity distribution unit.

In an optional implementation, the refrigeration system further includes a constant pressure water replenishment device, and the constant pressure water replenishment device is configured to replenish water and pressure to the cooling capacity distribution unit. Reliability of the refrigeration system is ensured.

In an optional implementation, the constant pressure water replenishment device includes a water replenishment tank and a surge tank connected to the water replenishment tank, and the water replenishment tank is connected to the liquid cooling distribution unit. Water replenishment and pressure stabilization of the liquid cooling system are realized by using the water replenishment tank and the surge tank.

In an optional implementation, the constant pressure water replenishment device is disposed in an equipment room on a side of the computer room. The constant pressure water replenishment device is disposed separately in the equipment room for easy maintenance and reduction of an occupied space in the computer room.

DETAILED DESCRIPTION

To make the objectives, technical solutions, and advantages clearer, the following further describes this disclosure in detail with reference to the accompanying drawings.

Figure 1:
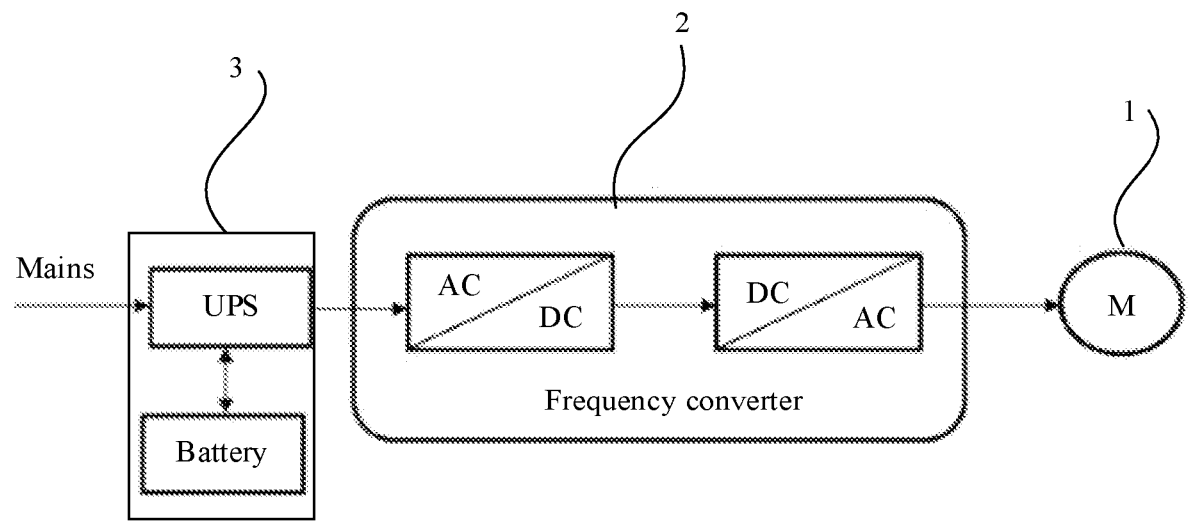
FIG. 1 is a schematic diagram of power supply of a liquid-cooled circulating pump in a conventional technology.

First, a cooling capacity distribution unit according to an embodiment is described. The cooling capacity distribution unit is applied to a liquid cooling system, and the liquid cooling system is configured to cool a computer room. The liquid cooling system includes a cooling tower configured to cool high-temperature liquid, a cooling plate configured to exchange heat for a chip in a server in the computer room, and a cooling capacity distribution unit configured to connect the cooling tower and the cooling plate. Cold water generated by the cooling tower is distributed to the cooling plate through the cooling capacity distribution unit. When a cooling capacity distribution unit in a conventional technology is in use, a liquid-cooled circulating pump driver in a cabinet is a frequency converter 50, and the frequency converter 50 only performs a driving function without a backup power function. As shown in FIG. 1, if the backup power function is needed, an additional backup power system 3 needs to be added independently. Specifically, a UPS and a battery are added, and a drive frequency converter 2 and a backup power system 3 of a liquid-cooled circulating pump 1 are independent, and an occupied space is relatively large. In addition, the UPS includes an AC-DC module and a DC-AC module, functions of which are the same as those of an AC-DC module and a DC-AC module in the frequency converter 2, reducing system efficiency and increasing system costs. Therefore, an embodiment provides a new cooling capacity distribution unit. The following describes the cooling capacity distribution unit in detail with reference to specific accompanying drawings and embodiments.

Figure 2:
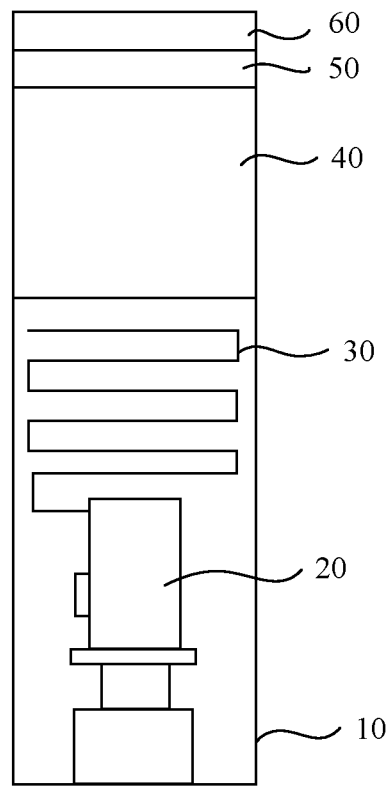
FIG. 2 is a schematic diagram of a structure of a cooling capacity distribution unit according to an embodiment.

FIG. 2 is a schematic diagram of a structure of a cooling capacity distribution unit according to an embodiment. The cooling capacity distribution unit includes a cabinet 10. The cabinet 10 is configured to bear functional devices of the cooling capacity distribution unit. For example, the functional devices may include a frequency converter 50, a power supply unit 40, a controller 60, and a power module. The power module may include a liquid-cooled circulating pump 20. The liquid-cooled circulating pump 20 is configured to drive a liquid flow in a water pipe assembly 30. In an optional solution, the power module may further include the water pipe assembly 30 connected to the liquid-cooled circulating pump 20. The water pipe assembly 30 is configured to connect to an external cooling tower and a cooling plate in a server. The frequency converter 50 and the power supply unit 40 are configured to supply power to the liquid-cooled circulating pump 20. The controller 60 is connected to the frequency converter 50 and is configured to control the liquid-cooled circulating pump 20 to operate. It should be understood that the functional devices in the cooling capacity distribution unit according to this embodiment may include all functional devices in the foregoing example, or may include only some of the functional devices. A functional device in the cabinet 10 may be determined based on an actual situation. In an optional implementation, the functional devices may include only the frequency converter 50, the power supply unit 40, and the power module (the power module includes only the liquid-cooled circulating pump 20). The pipe layer and the controller 60 are disposed in the cabinet 10 as optional accessories, or the pipe layer and the controller 60 are disposed outside the cabinet 10.

When the foregoing functional devices are fixed in the cabinet 10, a bearing bracket may be disposed in the cabinet 10, and each functional device is fixedly connected to the bearing bracket by using a threaded connector (a bolt or a screw), or is fixed in the cabinet 10 through riveting and clamping. In an optional solution, the foregoing functional devices may alternatively be directly fixedly connected to a sidewall, a bottom wall, or a top wall of the cabinet 10 by using a threaded connector. A specific fixing manner is not specifically limited in this disclosure.

Figure 3:
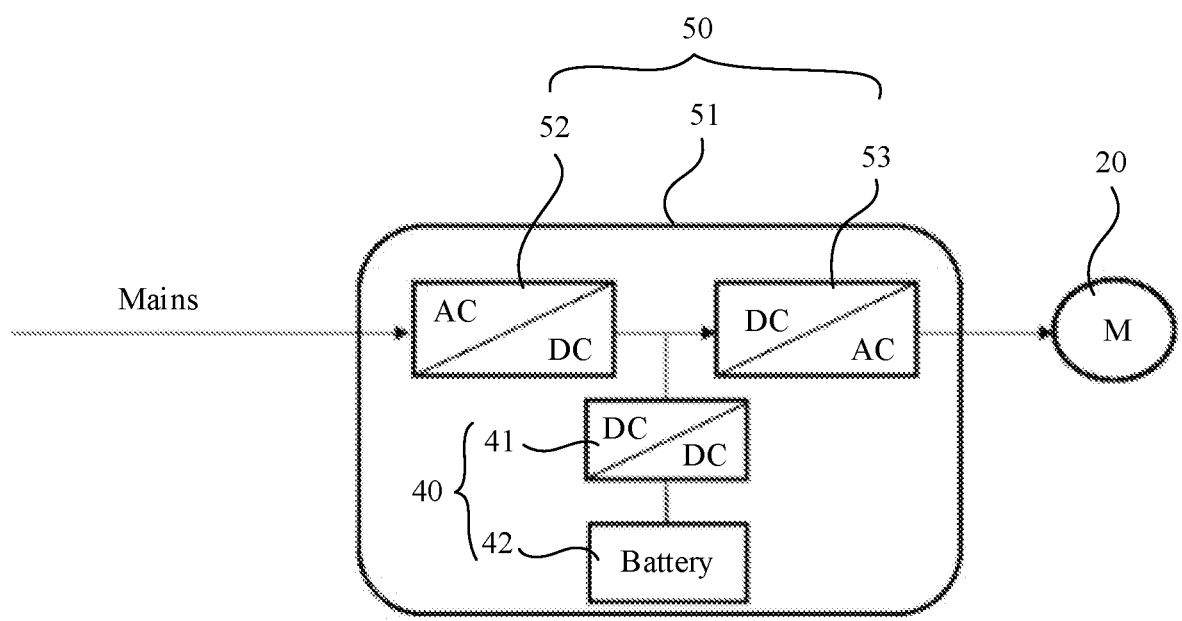
FIG. 3 is a schematic diagram of power supply of a liquid-cooled circulating pump according to an embodiment.

FIG. 3 is a schematic diagram in which the liquid-cooled circulating pump 20 is connected to the frequency converter 50 and the power supply unit 40. The frequency converter 50 according to this embodiment is configured to supply power to the liquid-cooled circulating pump 20. The frequency converter 50 mainly includes two power modules: an AC-DC module 52 and a DC-AC module 53. The AC-DC module 52 is configured to connect to mains, and the DC-AC module 53 is connected to the liquid-cooled circulating pump 20. The AC-DC module 52 converts mains (alternating current) into direct current, and then the DC-AC module 53 converts the direct current into alternating current that is applicable to the liquid-cooled circulating pump 20. The frequency converter 50 further includes a housing 51, and the AC-DC module 52 and the DC-AC module 53 are fixed in the housing 51. Ports that match the two modules are disposed on the housing 51, so that an external cable is electrically connected to the AC-DC module 52 and the DC-AC module 53 in the housing 51.

The cooling capacity distribution unit provides a backup power supply of the liquid-cooled circulating pump 20 by using the disposed power supply unit 40. The power supply unit 40 may specifically include a DC-DC module 41 and a backup battery 42. The DC-DC module 41 is an apparatus for converting electric energy of one voltage value into electric energy of another voltage value in a direct current circuit. As shown in FIG. 3, the DC-DC module 41 is connected to the DC-AC module 53 and is configured to supply power to the liquid-cooled circulating pump 20. Direct current provided by the backup battery 42 may be converted, by using the DC-DC module 41, into electric energy that matches the DC-AC module 53, and then the electric energy provided by the backup battery 42 is converted, by using the DC-AC module 53, into alternating current that matches the liquid-cooled circulating pump 20. As can be learned from the structure shown in FIG. 3, in a circuit system, the AC-DC module 52 in the frequency converter 50 is connected in parallel to the DC-DC module 41 in the power supply unit 40 and then connected to the DC-AC module 53 of the frequency converter 50, so that the DC-AC module 53 can selectively supply power to the liquid-cooled circulating pump 20 by using electric energy of mains converted by the AC-DC module 52, or selectively supply power to the liquid-cooled circulating pump 20 by using electric energy of the backup battery 42 converted by the DC-DC module 41. An effect of providing a backup power supply to the liquid-cooled circulating pump 20 by the cooling capacity distribution unit is implemented.

It can be learned from the foregoing structure that the cooling capacity distribution unit has its own backup power supply through the disposed power supply unit 40, and the backup power supply is the DC-DC module 41 and the backup battery 42. Compared with the power supply structure of the liquid-cooled circulating pump 20 shown in FIG. 1, the cooling capacity distribution unit eliminates a UPS and its backup power outside the cooling capacity distribution unit in the conventional technology, reducing costs and an occupied space. In addition, the power supply unit 40 is directly added with an interface (an interface connected between the DC-AC module 53 and the DC-DC module 41) on the basis of the frequency converter 50, to avoid low efficiency caused by multi-level conversion, reducing a power loss.

In an optional solution, when the AC-DC module 52 and the DC-AC module 53 of the frequency converter 50 are disposed in the housing 51, the DC-DC module 41 of the power supply unit 40 is disposed in the frequency converter 50, to be specific, is disposed in the housing 51 of the frequency converter 50. Correspondingly, a battery bridge arm interface is disposed in the housing 51, and the DC-DC module 41 is connected to the backup battery 42 by using the battery bridge arm interface. In the foregoing structure, the DC-DC module 41 is integrated into the housing 51 of the frequency converter 50, improving safety of the DC-DC module 41. When the DC-DC module 41 is disposed in the housing 51 of the frequency converter 50, the AC-DC module 52, the DC-AC module 53, and the DC-DC module 41 form a driver of the liquid-cooled circulating pump 20. The driver drives the liquid-cooled circulating pump 20 to operate.

In an optional solution, the backup battery 42 may also be disposed in the housing 51 of the frequency converter 50, to protect the AC-DC module 52, the DC-AC module 53, the DC-DC module 41, and the backup battery 42 described above by using the housing 51.

For the backup battery 42, different types of batteries may be selected as the backup battery 42 of the liquid-cooled circulating pump 20, and the backup battery 42 may be an acid (lead acid) or alkaline (cadmium nickel) storage battery. For example, the backup battery 42 uses a lithium battery.

Figure 4:
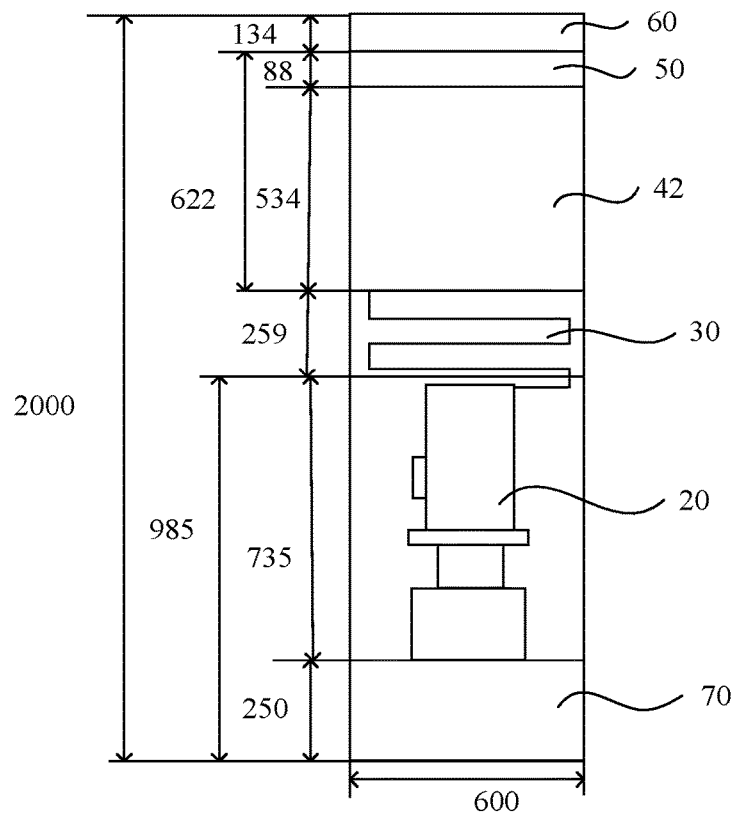
FIG. 4 is a schematic diagram of a structure of a cooling capacity distribution unit according to an embodiment.

FIG. 4 is a specific structure of a cooling capacity distribution unit. In the structure shown in FIG. 4, the cooling capacity distribution unit includes a cabinet 10, a frequency converter 50, a power supply unit, a controller 60, and a power module. Along a height direction of the cabinet 10, the power module, the power supply unit, the frequency converter 50, and the controller 60 are arranged from bottom to top along a height direction of the cabinet 10.

In an optional solution, the power module includes a shock absorber 70 in addition to a liquid-cooled circulating pump 20 and a water pipe assembly 30. The liquid-cooled circulating pump 20 is connected to the cabinet 10 by using the shock absorber 70. As shown in FIG. 4, the shock absorber 70 is fixed to a bottom plate of the cabinet 10, and the liquid-cooled circulating pump 20 is fixed to the shock absorber 70. The shock absorber 70 can reduce impact of vibration of the liquid-cooled circulating pump 20 on the cabinet 10 during operation, and further alleviate a reliability problem of another functional device connected to the cabinet 10 due to resonance.

In an optional solution, pump bodies of different models may be selected for the liquid-cooled circulating pump 20. For example, the liquid-cooled circulating pump 20 is a vertical pump or a horizontal pump. To be specific, liquid-cooled circulating pumps 20 of different models can be used to provide liquid flow power. A size of the liquid-cooled circulating pump 20 is not specifically limited, provided that the liquid-cooled circulating pump 20 can be disposed in the cabinet 10.

Still referring to FIG. 4, there is a pipe layer with a specific space above the liquid-cooled circulating pump 20. The pipe layer is used to dispose the water pipe assembly 30 in the power module. The water pipe assembly 30 may include a water pipe and a valve accessory. Specific structures of the water pipe and the valve accessory are not specifically limited, provided that the liquid-cooled circulating pump 20 can be connected to a cooling tower and a cooling plate.

When the foregoing functional devices are specifically disposed, the cabinet 10 shown in FIG. 4 is a rectangular cabinet 10. For example, the cabinet 10 is a rectangular cabinet 10 with a height of 2000 millimeters (mm) and a width of 600 mm. A space in the cabinet 10 is divided into a plurality of spaces along the height, and each space is used to bear a different functional device. For example, along the height direction, the space in the cabinet 10 is divided into a first accommodation space, a second accommodation space, a third accommodation space, and a fourth accommodation space. The first accommodation space with a height of 985 mm is used to accommodate the liquid-cooled circulating pump 20 and the shock absorber 70 in the power module, where the shock absorber 70 occupies a space with a height of 250 mm, and the liquid-cooled circulating pump 20 occupies a space with a height of 735 mm. The second accommodation space with a height of 259 mm is a pipe layer, and is used to accommodate the water pipe assembly 30 in the power module. The third accommodation space with a height of 622 mm is used to accommodate the power supply unit and the frequency converter 50. When a DC-DC module in the power supply unit is disposed in the frequency converter 50, the third accommodation space is divided into two parts: a space part (with a height of 534 mm) used to accommodate a backup battery 42 and a space part (with a height of 88 mm) used to accommodate the frequency converter 50 (including the DC-DC module of the power supply unit). The fourth accommodation space with a height of 134 mm is used to accommodate the controller 60.

In an optional implementation, the controller 60 according to this embodiment is further configured to detect a flow rate and a flow velocity of the liquid-cooled circulating pump 20. The controller 60 may detect an operation state of the liquid-cooled circulating pump 20 by using a device that matches the liquid-cooled circulating pump 20 such as a flowmeter and a pitometer.

In an optional implementation, the controller 60 may be a common controller 60 such as a single-chip microcomputer, a PLC, or an industrial personal computer. In addition, a principle that the controller 60 controls the liquid-cooled circulating pump to operate is a simple operating principle possessed by the controller 60. Details are not described herein.

It may be learned from the foregoing description that the functional devices included in the cooling capacity distribution unit according to this embodiment include only several components such as the shock absorber 70, the liquid-cooled circulating pump 20, the water pipe assembly 30, the backup battery 42, the frequency converter 50 (including the DC-DC module), and the controller 60. There are only a few functional devices in the cabinet, so that there can be more space to accommodate the liquid-cooled circulating pump 20 with higher power. For ease of understanding a gap between the cooling capacity distribution unit shown in FIG. 4 and the cooling capacity distribution unit in the conventional technology, the following provides comparison between the two cooling capacity distribution units and detailed description.

First, the cooling capacity distribution unit in the conventional technology is described. In the cooling capacity distribution unit in the conventional technology, a constant pressure water replenishment device, a plate heat exchanger, a liquid-cooled circulating pump, and a matching valve accessory are disposed. One side of the plate heat exchanger is connected to a cooling tower, and the other side of the plate heat exchanger is connected to a cooling plate, to implement heat exchange between hot water in the cooling plate and cold water in the cooling tower. The constant pressure water replenishment device is configured to replenish water in an entire liquid cooling system and maintain system pressure. It may be learned from the foregoing description that there are many internal components of the cooling capacity distribution unit in the conventional technology, and the cooling capacity distribution unit in the conventional technology includes different functions such as heat exchange, maintaining stability of system water pressure, and driving a liquid flow. However, due to a limited space in a cabinet, model selection of the components is limited. For example, the plate heat exchanger and the liquid-cooled circulating pump described above are both affected by the space in the cabinet. In addition, a corresponding filter needs to be disposed for the plate heat exchanger disposed in the cabinet. However, during an earlier flushing process of the filter, some manual valves need to be opened or closed. Due to the limited space in the cabinet, operation is difficult. In addition, in the conventional technology, a primary side of the cooling capacity distribution unit is cooling water, the plate heat exchanger in the cabinet will encounter scale formation after long-term operation, and thus the plate heat exchanger needs regular maintenance. In addition, because the plate heat exchanger in the cooling capacity distribution unit is a small plate heat exchanger, a fin spacing inside the plate heat exchanger is small, and the plate heat exchanger is prone to be dirty and blocked.

However, it may be learned from the cooling capacity distribution unit according to this embodiment that the cooling capacity distribution unit according to this embodiment includes only several functional devices such as the shock absorber 70, the liquid-cooled circulating pump 20, the water pipe assembly 30, the backup battery 42, the frequency converter 50 (including the DC-DC module), and the controller 60. The foregoing functional devices are all functional devices that serve to drive a liquid flow in the cooling plate. It may be understood that the cooling capacity distribution unit according to this embodiment is only a device configured to drive a liquid flow on a server side (drive a liquid flow in the cooling plate) in a refrigeration system. Therefore, there is a large space in the cabinet 10 of the cooling capacity distribution unit according to this embodiment to accommodate the liquid-cooled circulating pump 20, so that a liquid-cooled circulating pump with higher power can be selected, to improve efficiency of the cooling capacity distribution unit.

Table 1 below shows efficiency of using different circulating liquid-cooled circulating pumps. Table 1 shows different cases when a vertical pump and a horizontal pump are selected for the cooling capacity distribution unit and the cooling capacity distribution unit in the conventional technology.

TABLE 1

| Type of a water pump | | Water pump flow rate m³/h | Head mH₂O | Temperature difference between supply and return water: °C. | Electrical power KW | Bearing cooling load KW | Pump body size L*W*H (mm) | Quantity of cabinets in a pump cabinet pcs | Single cabinet load of a cold plate KW | Weight ratio of a cold plate | Total cooling capacity of a liquid cooling cabinet kw |
|---|---|---|---|---|---|---|---|---|---|---|---|
| Vertical pump | This application | 49.1 | 28 | 12 | 5.5 | 685.34 | 360*266*735 | 26 | 26.36 | 60% | 43.93 |
| | Existing | 31.3 | 28 | 12 | 4 | 436.84 | 340*252*676 | 26 | 16.8 | 60% | 28 |
| Horizontal pump | This application | 50 | 25 | 12 | 5.5 | 697.83 | 1021*340*494 | 26 | 26.84 | 60% | 44.73 |
| | Existing | 34 | 25 | 12 | 4 | 474.53 | 960*240*503 | 26 | 18.25 | 60% | 30.42 |

It may be learned from Table 1 that after power of the liquid-cooled circulating pump 20 is increased, the cooling capacity distribution unit may support 26 liquid cooling cabinets with a power density of 44 KW. Compared with the cooling capacity distribution unit in the conventional technology that can support only 26 liquid cooling cabinets with a power density of 28 KW to 31 KW, efficiency of the cooling capacity distribution unit is greatly improved.

It can be learned from the foregoing description that, because no plate heat exchanger is disposed in the cooling capacity distribution unit according to this embodiment, maintenance and repair of a device can be reduced, and a risk of water leakage in a computer room can be reduced. In addition, power of the cooling capacity distribution unit is increased, which can support a liquid cooling cabinet with higher power under a condition of a same percentage of a space occupied by the cabinet. With continuous evolution of a high power density of a liquid cooling cabinet in the future, the cooling capacity distribution unit in this embodiment occupies fewer cabinets in the computer room, which increases a quantity of cabinets that can be arranged per thousand square meters of the computer room. In addition, the cooling capacity distribution unit has a self-contained power function (power supply unit), and eliminates an external UPS and its backup power, reducing costs and an occupied space. The power supply unit is added with an interface on the basis of the frequency converter 50 to avoid low efficiency of multi-level conversion.

Figure 5:
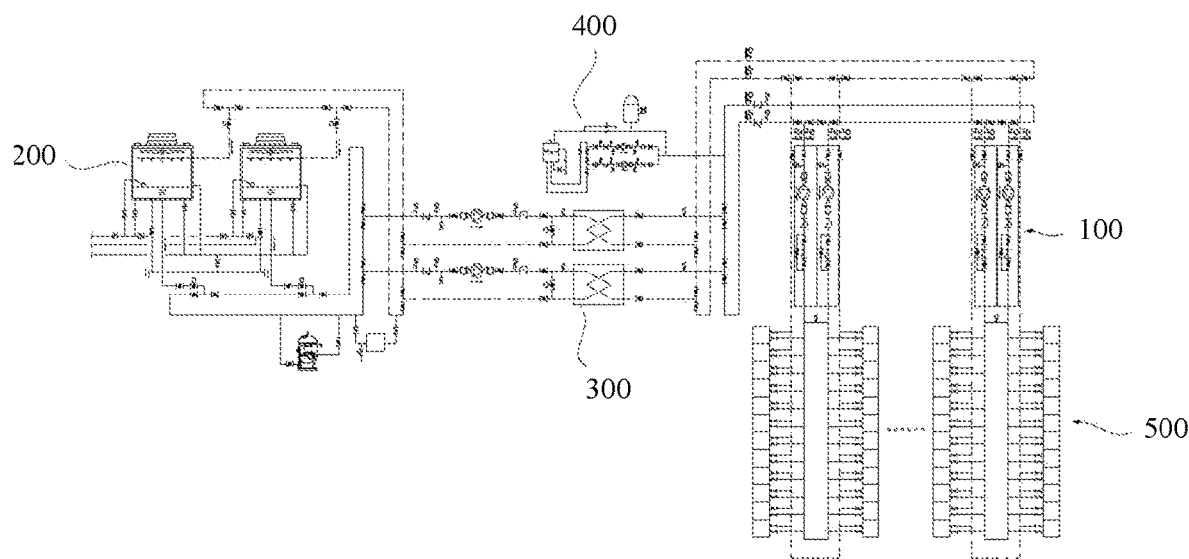
FIG. 5 is a schematic diagram of a structure of a liquid cooling system according to an embodiment.

FIG. 5 shows a liquid cooling system according to an embodiment. The liquid cooling system is configured to cool a computer room 500. The liquid cooling system includes a refrigeration system and the cooling capacity distribution unit 100 described above and connected to the refrigeration system. The refrigeration system is configured to generate cold water for heat exchange with a cooling plate. The refrigeration system includes a cooling tower 200 and a plate heat exchanger 300 connected to the cooling tower 200. The cooling tower 200 and the plate heat exchanger 300 may be connected by using a pipeline, and the pipeline may use an existing pipeline. Details are not described herein. In addition, a pump for driving water to flow is disposed on the pipeline, and a disposing position of the pump is not specifically limited. As shown in FIG. 5, the plate heat exchanger 300 is connected to the cooling capacity distribution unit 100 by using the pipeline. Heat exchange is performed on liquid in the cooling plate in the computer room 500 directly in the plate heat exchanger 300 to implement one-level heat exchange, and another plate heat exchanger 300 does not need to be disposed in the cooling capacity distribution unit 100, simplifying a structure of the cooling capacity distribution unit 100.

Figure 6:
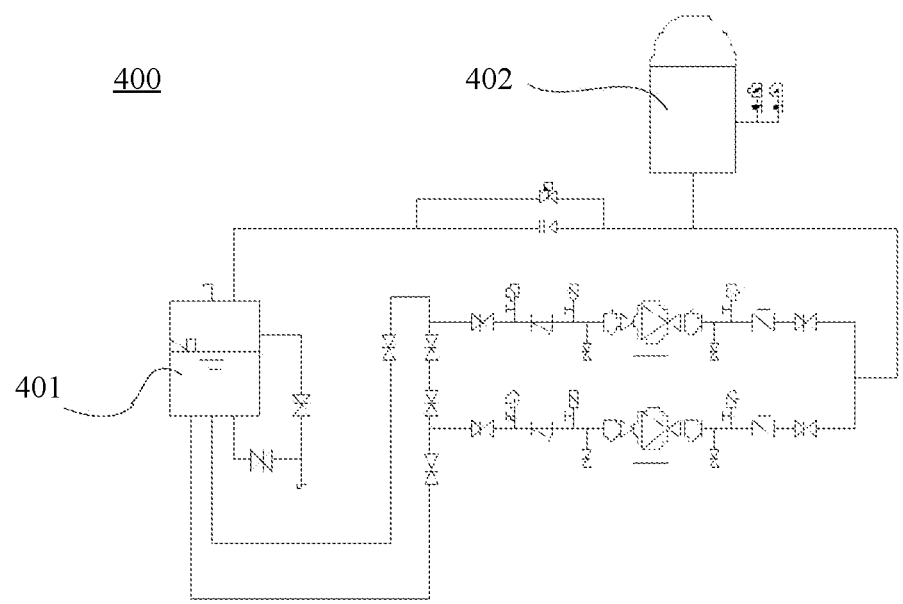
FIG. 6 is a schematic diagram of a constant pressure water replenishment device according to an embodiment.

In an optional solution, the refrigeration system further includes a constant pressure water replenishment device 400, and the constant pressure water replenishment device 400 is configured to replenish water and pressure to the cooling capacity distribution unit 100. In a specific implementation shown in FIG. 6, the constant pressure water replenishment device 400 includes a water replenishment tank 401 and a surge tank 402 connected to the water replenishment tank 401, and the water replenishment tank 401 is connected to the liquid cooling distribution unit. The constant pressure water replenishment device 400 may be disposed in an equipment room on a side of the computer room 500. The constant pressure water replenishment device 400 is disposed separately in the equipment room for easy maintenance and reduction of an occupied space in the computer room 500.

It can be learned from the foregoing description that an overall solution of a liquid cooling system is optimized, and a component that is not related to cooling capacity distribution of the system, such as the plate heat exchanger 300 and the constant pressure water replenishment device 400, is removed from the cabinet and the computer room 500, and is placed in the equipment room near the computer room 500. The plate heat exchanger 300 and the constant pressure water replenishment device 400 are configured with the computer room 500 as a unit of model selection. A backup of the computer room 500 is set. As a selected model increases and a disposing position changes (the equipment room), an open cooling tower 200 may be configured at a front end of the plate heat exchanger. Only one constant pressure water replenishment device needs to be configured in the system.

The cooling capacity distribution unit 100 in this embodiment is integrated and optimized based on the overall solution, reducing a redundant waste and a system failure rate of a device, and reducing solution costs of the liquid cooling system.

A small plate heat exchanger of the existing cooling capacity distribution unit 100 is configured as a large plate heat exchanger of the equipment room, so that system compatibility is improved. Cooling water of a primary-side cooling tower 200 may directly enter the large plate heat exchanger, avoiding multi-level heat exchange and improving overall heat exchange efficiency of the system. In addition, disposing the plate heat exchanger in the equipment room facilitates maintenance and repair of the device, reducing a risk of water leakage in the computer room 500.

Power of the cooling capacity distribution unit 100 is increased, which can support a liquid cooling cabinet with higher power under a condition of a same percentage of a space occupied by the cabinet. With continuous evolution of a high power density of a liquid cooling cabinet in the future, a new cooling capacity distribution unit 100 occupies fewer cabinets in the computer room 500, which increases a quantity of cabinets that can be arranged per thousand square meters of the computer room 500.

The cooling capacity distribution unit according to this embodiment has a self-contained power function, to eliminate a UPS and its backup power outside the cooling capacity distribution unit, reducing costs and an occupied space. The self-contained power is added with an interface on the basis of a driver to avoid low efficiency of multi-level conversion.

The foregoing descriptions are merely specific implementations, but are not intended to limit the protection scope of this disclosure. Any variation or replacement readily figured out by a person skilled in the art within the technical scope disclosed shall fall within the protection scope of this disclosure. Therefore, the protection scope of this disclosure shall be subject to the protection scope of the claims.

What is claimed is:

1. A cooling capacity distribution system comprising:
   a cabinet;
   a liquid-cooled circulating pump disposed in the cabinet;
   a frequency converter comprising:
   an alternating current (AC)-direct current (DC) system configured to connect to a mains; and
   a DC-AC system connected to the liquid-cooled circulating pump and configured to supply power to the liquid-cooled circulating pump; and
   a power supply unit connected to the DC-AC system, configured to supply backup power to the liquid-cooled circulating pump, and comprising:
   a backup battery disposed in the cabinet; and
   a DC-DC system connected to the backup battery.

2. The cooling capacity distribution system of claim 1, wherein the frequency converter further comprises a housing, and wherein the housing comprises a battery bridge arm interface.

3. The cooling capacity distribution system of claim 2, wherein the DC-DC system is disposed in the frequency converter and further connected to the backup battery via the battery bridge arm interface.

4. The cooling capacity distribution system of claim 3, further comprising a controller connected to the frequency converter.

5. The cooling capacity distribution system of claim 4, wherein the controller is configured to control operation of the liquid-cooled circulating pump.

6. The cooling capacity distribution system of claim 5, wherein the frequency converter is positioned above the power supply unit within the cabinet, and wherein the controller is positioned above the frequency converter within the cabinet.

7. The cooling capacity distribution system of claim 6, further comprising a pipe layer connected to the liquid-cooled circulating pump.

8. The cooling capacity distribution system of claim 7, wherein the pipe layer is disposed between the backup battery and the liquid-cooled circulating pump.

9. The cooling capacity distribution system of claim 1, further comprising a shock absorber.

10. The cooling capacity distribution system of claim 9, wherein the liquid-cooled circulating pump is connected to the cabinet via the shock absorber.

11. The cooling capacity distribution system of claim 1, wherein the liquid-cooled circulating pump is a vertical pump.

12. The cooling capacity distribution system of claim 1, wherein the liquid-cooled circulating pump is a horizontal pump.

13. A liquid cooling system comprising:
    a refrigeration system; and
    a cooling capacity distribution system connected to the refrigeration system and comprising:
    a cabinet;
    a liquid-cooled circulating pump disposed in the cabinet;
    a frequency converter comprising:
    an alternating current (AC)-direct current (DC) system configured to connect to a mains; and
    a DC-AC system connected to the liquid-cooled circulating pump and configured to supply power to the liquid-cooled circulating pump; and
    a power supply unit connected to the DC-AC system, configured to supply backup power to the liquid-cooled circulating pump, and comprising:
    a backup battery disposed in the cabinet; and
    a DC-DC system connected to the backup battery.

14. The liquid cooling system of claim 13, wherein the refrigeration system comprises:
    a cooling tower; and
    a plate heat exchanger connected to the cooling tower.

15. The liquid cooling system of claim 14, wherein the plate heat exchanger is connected to the cooling capacity distribution system.

16. The liquid cooling system of claim 15, wherein the refrigeration system further comprises a constant pressure water replenishment device.

17. The liquid cooling system of claim 16, wherein the constant pressure water replenishment device is configured to replenish water and pressure to the cooling capacity distribution system.

18. The liquid cooling system of claim 17, wherein the constant pressure water replenishment device comprises:
    a water replenishment tank; and
    a surge tank connected to the water replenishment tank.

19. The liquid cooling system of claim 18, wherein the water replenishment tank is connected to the cooling capacity distribution system.

20. The liquid cooling system of claim 13, wherein the cooling capacity distribution system further comprises a shock absorber, and wherein the liquid-cooled circulating pump is connected to the cabinet via the shock absorber.

* * * * *